(12) United States Patent
Jakka et al.

(10) Patent No.: US 8,347,200 B1
(45) Date of Patent: Jan. 1, 2013

(54) REDUCED MEMORY MULTI-CHANNEL PARALLEL ENCODER SYSTEM

(75) Inventors: Bhasker R. Jakka, San Diego, CA (US); Dillip K. Dash, San Diego, CA (US)

(73) Assignee: Stec, Inc., Santa Ana, CA (US)

( * ) Notice: Subject to any disclaimer, the term of this patent is extended or adjusted under 35 U.S.C. 154(b) by 0 days.

(21) Appl. No.: 13/526,446

(22) Filed: Jun. 18, 2012

Related U.S. Application Data

(60) Provisional application No. 61/513,485, filed on Jul. 29, 2011.

(51) Int. Cl.
*G06F 11/00* (2006.01)
*H03M 13/00* (2006.01)
(52) U.S. Cl. .................................. 714/810; 714/776
(58) Field of Classification Search .............. 714/746, 714/752, 763, 776, 800, 810
See application file for complete search history.

(56) References Cited

U.S. PATENT DOCUMENTS

| | | | | |
|---|---|---|---|---|
| 5,701,160 A | * | 12/1997 | Kimura et al. | 375/240.14 |
| 6,249,855 B1 | * | 6/2001 | Farrell et al. | 712/23 |
| 8,095,846 B2 | * | 1/2012 | Ziesler et al. | 714/758 |

OTHER PUBLICATIONS

Savin et al., Binary tree search Architecture for efficient implementation of round robin arbiters, 2004, IEEE, p. V-333-V-336.*

* cited by examiner

*Primary Examiner* — Shelly A Chase
(74) *Attorney, Agent, or Firm* — McDermott Will & Emery LLP

(57) ABSTRACT

A memory includes matrix data stored thereon for use by the plurality of encoders. An arbiter unit receives, from the plurality of encoders, respective requests for a portion of the matrix data stored in the shared memory, and facilitates providing a portion of the matrix data to the plurality of encoders at staggered times for use in respective encoding operations.

20 Claims, 6 Drawing Sheets

REDUCED MEMORY MULTI-CHANNEL PARALLEL ENCODER SYSTEM

CROSS-REFERENCES TO RELATED APPLICATIONS

This application claims priority from U.S. Provisional Application No. 61/513,485, entitled METHOD AND APPARATUS FOR REDUCED MEMORY MULTI-CHANNEL LDPC ENCODER/DECODER SYSTEM and filed Jul. 29, 2011, which is incorporated herein by reference in its entirety.

TECHNICAL FIELD

The subject technology relates generally to data connections that utilize error correction coding (ECC).

BACKGROUND

The subject disclosure relates to digital communication applications where error correction coding (ECC), such as Low Density Parity Check (LDPC) codes, is used. For example, both data storage applications (e.g., solid state drives, hard disk drives, etc.) and data communication systems (e.g., Wi-Fi, WiMax, Ethernet, etc.) may use ECC such as LDPC to correct errors that occur when storing and reading or sending and receiving information.

As throughput and performance requirements increase, systems rely on multi-channel encoding and decoding operations to meet these requirements. For example, in solid state drives (SSDs), many independent encoding and decoding operations may be performed when writing and reading host data to and from the media, respectively. As the number of channels increases and the complexities of the error corrections codes increase, the hardware and operation requirements become increasingly difficult and expensive to meet.

SUMMARY

A multi-channel encoding architecture for a data storage system is described herein. The multi-channel encoding architecture of the subject technology reduces the system memory requirements by utilizing an arbiter unit to allow multiple LDPC encoders to access a single generator matrix storage device during encoding operations. The cyclic nature of the circulants in the generator matrix allow the LDPC encoders to operate with intermittent access to the storage device. The arbiter unit regulates access to the storage device to handle simultaneous requests from multiple encoders.

According to one aspect, a system may include a shared memory including code-generating matrix data stored thereon, a plurality of encoders operably connected to the shared memory, each encoder configured to generate a codeword based on a data payload, and an arbiter unit operably connected to the plurality of encoders and the shared memory. In this respect, the arbiter unit may be configured to receive, from the plurality of encoders, respective requests for a portion of the matrix data, and provide the portion of the matrix data to the plurality of encoders at staggered times for use in respective encoding operations.

In another aspect, a method may include receiving a data payload at an encoder, providing a request, to an arbiter unit, for a portion of a matrix stored at a shared memory location, receiving the portion of the matrix at one of a predetermined number of access times, each access time corresponding to one of the plurality of encoders, encoding a portion of the data payload based on the portion of the matrix, the encoding operating in parallel with an encoding initiated by at least one other encoder, and repeating the steps of requesting, receiving, and encoding until the data payload is encoded.

In a further aspect, a system may include a shared memory including code-generating matrix data stored thereon, an arbiter unit configured to provide access to the shared memory according to a predetermined sequence, a plurality of encoders operably connected to the arbiter unit and the shared memory. In this respect, each encoder may be configured to receive a data payload, receive a first set of elements based on the matrix data according to a sequence designated by the arbiter unit, encode, on receiving the first set of elements, a portion of the data payload based on the first set of elements, the portion of the data payload being encoded in parallel with an encoding initiated by at least one other encoder, and receive a second set of elements after the encoding of the portion of the data payload is completed, according to the sequence designated by the arbiter unit.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

The subject technology provides a low density parity check (LDPC) code decoder that supports different code rates, and maintains a low overall footprint of internal memory space required for processing variable-rate codewords. In this regard, an encoder may be set to encode a data payload into a codeword at one of a predetermined plurality of code rates. Multiple encoders may be used in parallel to encode multiple respective codewords from one or more data payloads received from a host system. On receiving a data payload, the data payload may be encoded using different portions of a generator matrix ("G matrix") at specific intervals to conserve the amount of memory space required by each individual encoder. A shared memory space, configured to support the multiple encoder configuration, may include just enough data to generate each respective portion of the G matrix as needed by respective encoders during the encoding process.

An LDPC code, which is a linear block code, c of length n may be generated from a G matrix and a data payload u (for example, a series of k bits of data), as shown in Equation (1).

$$c = u \cdot G \quad (1)$$

Conversely, the codeword may be decoded using a parity-check matrix, also termed an "H matrix." An H matrix may be generated from a corresponding G matrix, and vice versa, such that $G \cdot H^T = 0$. In LDPC codewords, the Shannon-limit can be achieved by increasing the codeword length n. However, the longer the codeword length n, the larger the generator matrix becomes. As a result, the encoder requires a high-capacity memory (e.g., RAM, ROM, etc.) to store the coefficients of G, and consequently hardware implementation becomes large. Similarly, the parity check matrix H is stored for decoding operations to correct errors. However, the parity check matrix of a quasi-cyclic LDPC (QC-LDPC) codeword is a sparse matrix and requires less storage space compared to the generator matrix.

Figure 1A:
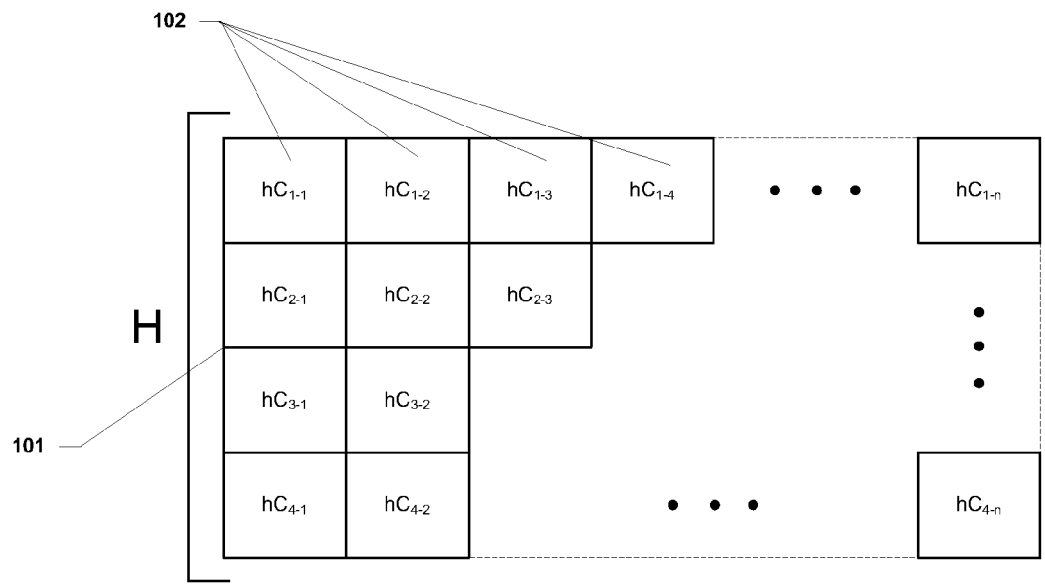
FIGS. 1A and 1B depict an example parity-check matrix for decoding a LDPC codeword to produce a data payload, and a corresponding code-generating matrix for encoding the data payload to generate the codeword.

FIG. 1A depicts an example parity-check matrix ("H matrix") for decoding a LDPC codeword to produce a decoded data payload, according to one aspect of the subject technology. During a decoding operation, each bit position of a row in the parity-check matrix may correspond to a bit position of a codeword c (not shown), such that a product of the row and codeword c produces a zero result for any selected row i (for example, $H^i \cdot c^T = 0$). In the depicted example, the parity-check matrix is constructed such that the matrix includes many more 0 or null values than non-zero values (for example, 1's) in each row. The parity-check matrix is also constructed from a number of circulants. A circulant may be a sub-matrix in the form of an identity matrix. In some aspects, each circulant 102 of parity-check matrix is a permutation of a single p×p identity matrix generated, for example, by cyclically shifting the identity matrix. For each circulant, a system may store (for example, in a memory) a non-zero starting bit position (column or row) of the circulant so that the circulant can be generated by cyclically shifting the starting bit position of the identity matrix to complete the circulant. In this respect, a memory or other storage device for storing information to generate circulants may need only include a number of bits required to identify one bit position for each circulant in the parity-check matrix. In an example wherein an H matrix for decoding a codeword of 4608 bytes includes 4 rows of 24 circulants, with each circulant having a circulant size p=192, the H matrix would require a total memory size of 768 bytes: 8 bits (for the starting position of p)×4×24).

Figure 1B:
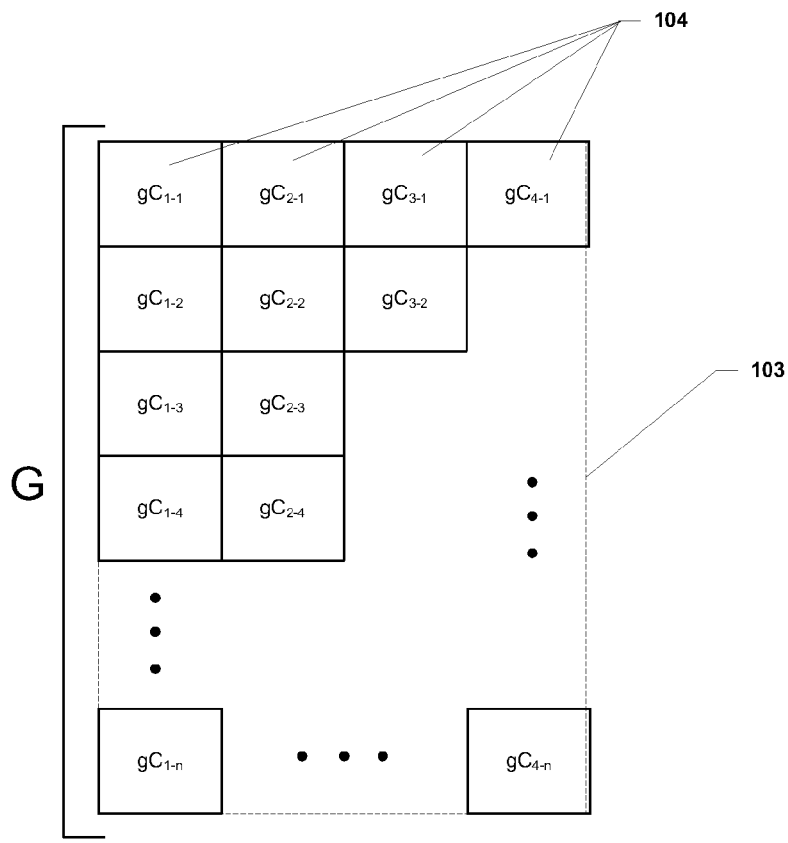

FIG. 1B depicts an example code-generating matrix ("G matrix") for encoding a data payload to generate a codeword, according to one aspect of the subject technology. The G matrix may be constructed as $G = g_{(identity)} + g_{(x)}$, where $g_{(identity)}$ is an identity matrix and $g_{(x)}$ includes a bit pattern determined, for example, by an error correction algorithm. In this manner, a codeword c includes a first section providing the original data payload u and a second section including error correction data generated by the product of U and G. G matrix 103, as an inverse of the previously described H matrix, is constructed such that it includes many more non-zero values (for example, 1's) than zero or null values at each row position. In this regard, the non-zero values of a single row of G matrix 103 may not be easily repeatable, and the entire row must be stored. Similar to the H matrix, G matrix 103 may be constructed from a number of circulants 104, with each row of a circulant being generated by a cyclical shifting of the preceding row by, for example, one bit. Accordingly, a circulant may be recreated from a single circulant row stored in memory, thereby reducing the amount of memory space required to store each circulant, and thus the corresponding G matrix. For example, to store 4 rows of 24 G matrix circulants, each circulant having a circulant size p=192, a memory size of 18,432 bytes would be required (192 bits×4×24) to generate a single G matrix.

Figure 2:
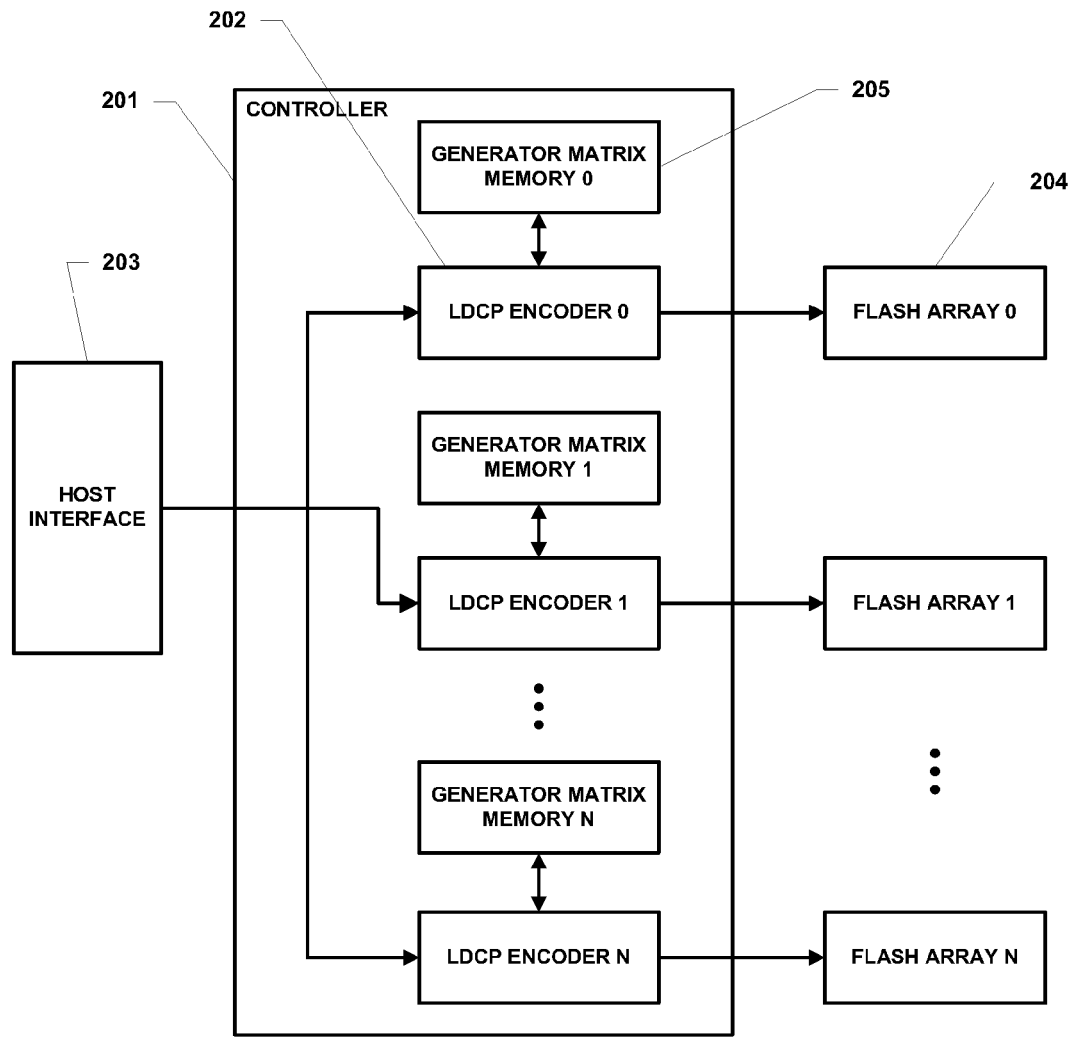
FIG. 2 is a block diagram illustrating example components of a multi-channel encoding architecture in a data storage system.

FIG. 2 is a block diagram illustrating example components of a multi-channel encoding architecture in a data storage system. In one aspect, as depicted in FIG. 2, the data storage system includes a data storage controller 201 with multiple LDPC encoder modules 202 (1 to N) configured to generate codewords using data received via a host interface 203 before sending the codewords to be stored in a respective flash array 204 (1 to N). Each LDPC encoder module 202 includes or is operably coupled to a respective generator matrix storage 205, which stores a code-generating matrix G used to produce codewords.

Generator matrix storage 205 may be implemented using any of a number of storage devices. For example, the storage may be a ROM or flash memory. Alternatively, the storage may be dynamic memory that is loaded with the generator matrix information by the controller at startup or boot time. As noted above, the storage of a code-generating matrix requires a large amount of memory, especially for long codeword lengths. If each LDPC encoder 202 is provided with a generator matrix storage 205, as depicted in FIG. 2, the device size can be prohibitive in terms of both area and power consumption.

Figure 3:
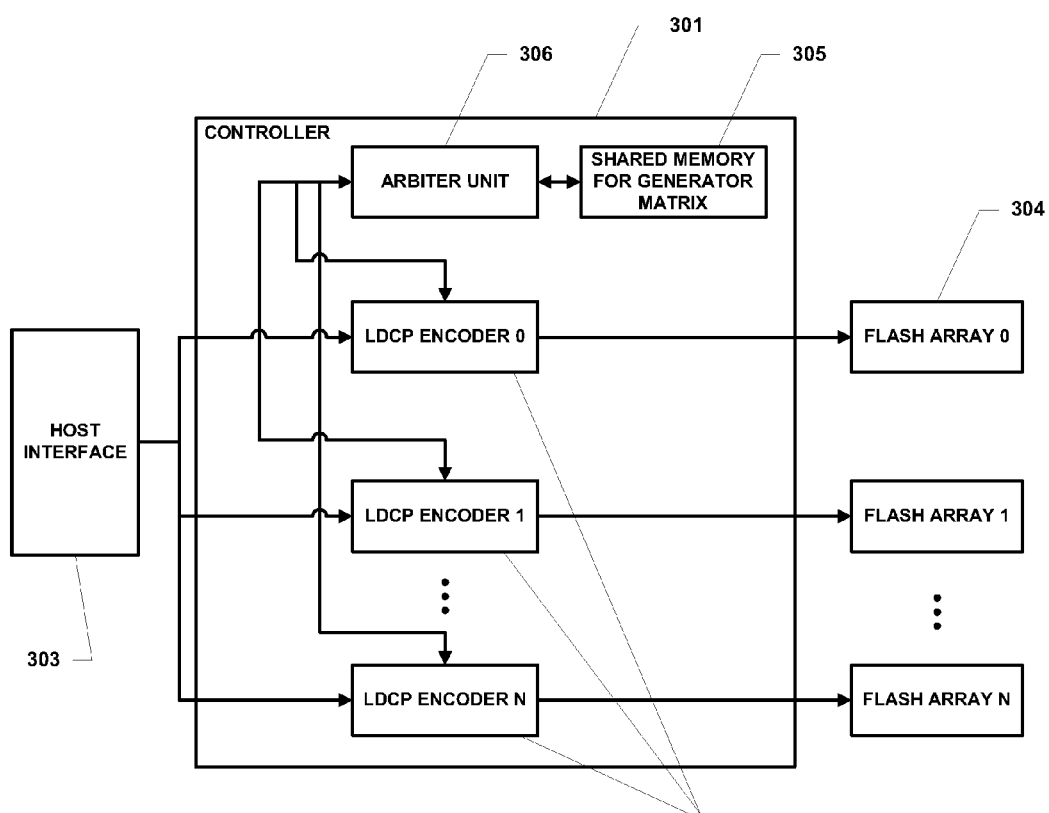
FIG. 3 is a block diagram illustrating an example system for encoding data using a shared memory and multiple encoders operating in a parallel encoding architecture.

FIG. 3 is a block diagram illustrating an example system for encoding data using a shared memory and multiple encoders operating in a parallel encoding architecture according to one aspect of the subject technology. A data storage controller 301 may include multiple LDPC encoder modules (1 to N) 302 configured to generate codewords using data received via a host interface 303. The generated codewords may be stored in one or more flash arrays 404 (1 to N) corresponding to a respective encoder module 302. Unlike the data storage system depicted in FIG. 2, each of the LDPC encoders is not coupled to a respective generator matrix storage. Rather, a single generator matrix storage is accessed by all of the LDPC encoders via an arbiter unit. This arrangement significantly reduces the memory requirements for storing the LDPC matrices, which reduces the memory components in the system and consequently reduces the testing burdens at the design and manufacturing stages.

Shared memory 305 includes code-generating matrix data stored thereon for use by encoders 302. The code-generating matrix data may include the coefficients of a complete code-generating matrix (for example, matrix 103), or enough coefficients to generate the matrix (for example, a row of a quasi-circulant code-generating matrix) at runtime, during an encoding process. An arbiter unit 306 is operably connected to each of the encoders 302 and shared memory 305, and is configured to provide portions of the code-generating matrix to encoders 302 according to a timing schedule (for example, at staggered times, according to a data pipeline, time-slice, or the like) to facilitate encoding of data payloads in parallel (for example, during overlapping periods of time). Arbiter unit 306 may include arbiter instructions stored on an associated memory (for example, a non-transitory memory medium) that, when executed, cause the arbiter unit to receive, from encoders 302, respective requests for a portion of the generating matrix data, and, based on the timing schedule, provide the portion of the generating matrix data to each encoder 302 at staggered times for use in an encoding operation.

In some aspects, arbiter unit 306 may provide the portion of the matrix data to each encoder 302 by providing access to shared memory 305. In one example, an encoder 302 may request access to shared memory 305, and arbiter unit 306 may wait until a predetermined point in the timing schedule associated with the requesting encoder before signaling the encoder that it may access shared memory 305. In another example, arbiter unit 306 may provide the portion of the matrix data to the encoder by temporarily storing the portion of the matrix data in a data buffer for retrieval by the encoder.

A series of encoding operations may be required to encode a data payload. An encoder 302 may encode x bits of the data payload at a time. For each x bits of data, encoder 302 may use a column of circulants from the G matrix. Accordingly, encoder 302 may request matrix data to create the column from arbiter unit 306, and once the column (or portion thereof) is created, use the column to encode the corresponding portion of the data payload. Encoder 302 may then request matrix data to create the next column and begin encoding the next corresponding portion of the data payload.

For example, an encoder 302 may perform a first encoding operation to facilitate encoding a first payload portion of the data payload based on the portion of the matrix data provided by arbiter unit 306. On completion of the first encoding operation, encoder 302 may request (for example, from the arbiter unit) a subsequent portion of the matrix data to facilitate an encoding of a subsequent portion of the data payload. Each encoding operation may further be broken down to include several sub-operations. For example, during the first encoding operation, encoder 302 may encode a first part of the first payload portion based on the provided portion of the matrix, shift the provided portion of the matrix to generate a shifted portion of the matrix, and then encode a different part of the first payload portion based on the shifted portion of the matrix. The steps of shifting and encoding may then be repeated until the first payload portion is encoded. When the payload of data is encoded, controller 301 may cause the encoded data to be stored in a flash memory 304.

According to one aspect of the subject technology, the code-generating matrix may be a high-density matrix formed of multiple cyclic submatrices, or circulants. Because the submatrices are cyclic, the code-generating matrix may be stored using only the first rows of each submatrix. The LDPC encoders are configured to regenerate the submatrices as needed by retrieving the first row of the submatrices, storing the row locally, and shifting the row to generate the other rows in the submatrices. Accordingly, each LDPC encoder may need to access the generator matrix storage only when the encoder needs another row of submatrices for processing. With this arrangement, encoders 302 can request the matrix data via arbiter unit 306 on respective cycles without having to wait a large number of cycles for another encoder to request and receive the entire generator matrix from the generator matrix storage.

The provided portion of the code-generating matrix may include circulant data for facilitating the generation of at least a portion of one or more of the plurality of circulants. In this respect, controller 301 may receive a payload of data, and arbiter unit 306 may, on execution of instructions, maintain an index of the plurality of circulants (and/or of position within the circulants) and a current iteration of the index for encoders 302. Arbiter unit 306 may receive an indication that an encoder 302 is initiating an encoding of a portion of the payload data, and facilitate providing, on the indication, the circulant data based on a current iteration of the code-generating matrix for the encoder 302. In some aspects, the circulant data may be comprised of one or more one-dimensional arrays (for example, rows or columns of data), with each array corresponding to a respective circulant. If there are multiple rows of circulants in the code-generating matrix stored in shared memory 305 then an encoder 302 may receive a one-dimensional array (for example, a row of a circulant) corresponding to each circulant in a row or column of circulants in the code-generating matrix. For example, with reference to FIG. 1B, the encoder may receive a one-dimensional array from $gC_{1-1}$, and a one-dimensional array from each other circulant $gC_{2-1}$ to $gC_{4-1}$ at the same index within the circulant (for example, vertically or horizontally).

The encoding operation performed by an encoder may facilitate an encoding of each bit of the payload of data based on a bit value at a corresponding position of each of the multiple one-dimensional arrays. For example, if there are 4 rows and 24 columns of circulants in a generator matrix then, on a first clock cycle, the encoding operation may retrieve the first row (a one-dimensional array) of each circulant in a column of circulants. If each row is a one-dimensional array then 4 one-dimensional arrays will be retrieved. The 4 arrays may then be used by the encoder to recreate the column of circulants. In one example, the encoder partially encodes the data payload using a one-dimensional array from each circulant in the column, and then the arrays are shifted to generate the second row of each circulant, and so forth, until the encoder has encoded that portion of the payload using all of the circulants in a column of the code-generating matrix. The encoders may then request the first row of each circulant in the next column, and continue encoding in the same manner until the data payload is completely encoded. After a first encoder has requested and has been provided a portion of matrix data from the arbiter, a different encoder may make a request for the same portion of the matrix data to perform an encoding of a different payload, all while the first encoder is encoding, shifting, encoding, and so on. If there are 24 columns of circulants in the code-generating matrix then an encoder may make 24 requests to facilitate encoding a data payload. In this manner, multiple encoders may operate in a parallel fashion to encode multiple data payloads.

In the event that more than one LDPC encoder requests another row of matrix information simultaneously, the arbiter unit implements an access algorithm to control access to the single generator matrix storage. For example, the arbiter unit may utilize a round robin access algorithm to handle conflicting access requests to the generator matrix storage.

Accordingly, the subject technology provides a solution that is able to generate LDPC codewords using parallel encoding, with a complexity comparable to an encoder implementation that generates a single LDPC codeword using a single encoder. The subject technology may be intended to be used in products using different flash chips with different raw error rates. This way, an ASIC used to implement the controller, encoder, and decoder aspects can be more versatile than single LDPC code implementations.

As described previously, a code-generating matrix may be comprised of circulants. In some aspects, LDPC code lengths may be constant (for example, 4608 bits). In other aspects, code lengths may be variable, and, thus, the code-generating matrix may change, depending on the rate. Table A provides example code rates and corresponding circulant information. The "row weight" parameter indicates how many circulants are included in a row of a corresponding code-generating matrix, further, and column weight indicates how many rows of circulants may be included in the code-generating matrix. The "circulant size" parameter indicates the number of rows in any given circulant, and, consequently, the number of bit values of a single row or column comprising the circulant. Different codes have different circulant sizes and different row weights.

TABLE A

| Code name | Length | Rate | Data Payload | Circulant size | Column weight | Row weight |
|---|---|---|---|---|---|---|
| POR4 | 4608 | 0.8333 | 3840 | 192 | 4 | 24 |
| POR5 | 4608 | 0.8750 | 4032 | 144 | 4 | 32 |
| POR6 | 4608 | 0.8889 | 4096 | 128 | 4 | 36 |
| POR7 | 4608 | 0.9167 | 4224 | 96 | 4 | 48 |
| POR8 | 4608 | 0.9375 | 4320 | 72 | 4 | 64 |

In order to support multiple LDPC codes with different rates in one implementation, a straightforward design may include code-generating matrix memory being duplicated for each encoder 302. The biggest components in a LDPC encoder, however, may be memory to store the code-generating matrix. Thus, providing parallel encoding may be cost-prohibitive based on the size of memory space required to store code-generating matrices for the encoders. The subject technology solves this problem by providing a single code-generating matrix memory that may be shared between multiple encoders.

Figure 4:
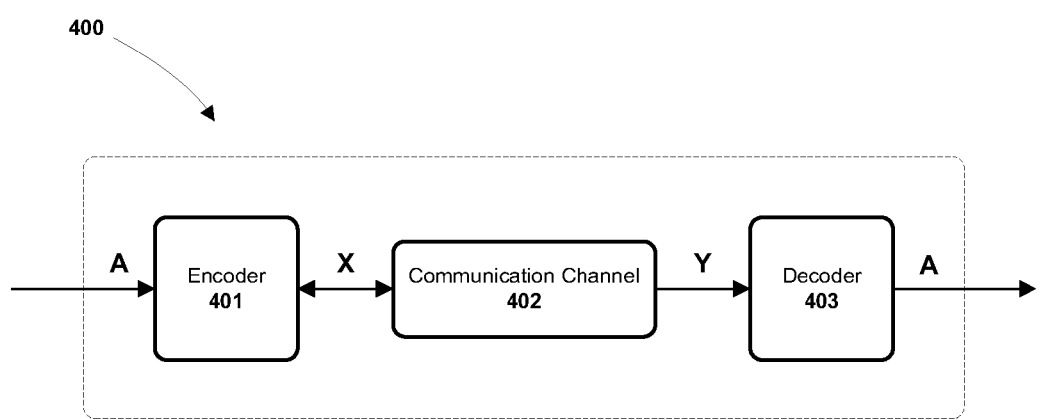
FIG. 4 depicts an exemplary encoder, communication channel, and decoder for the encoding, transmission, and decoding of data.

FIG. 4 depicts an exemplary encoder 401, communication channel 402, and decoder 403 for the encoding, transmission, and decoding of data, according to one aspect of the subject technology. Encoder 401 processes input data A to produce a codeword X, including, for example, a data payload appended by error correction data. Encoder 401 is configured to encode a data payload u using the previously described G matrix 101, to produce a codeword X. Codeword X may then be transmitted over communication channel 402 to decoder 403. Decoder 403 may perform data decoding operations including, for example, previously described parity check matrix 401, to reconstruct codeword X. As part of decoding operations, decoder 403 may attempt to reconstruct the original word $X=\{x_1, x_2, \ldots x_n\}$ from a received word $Y=\{y_1, y_2, \ldots y_n\}$. Received word Y may include soft values (unverified values) for $y_1, y_2, \ldots y_n$ provided from, for example, a channel detector (for example, a soft-output Viterbi detector). Once codeword X has been reconstructed, decoder 403 may include a channel decoder for removing the redundant error correction data to produce original data input A.

Figure 5:
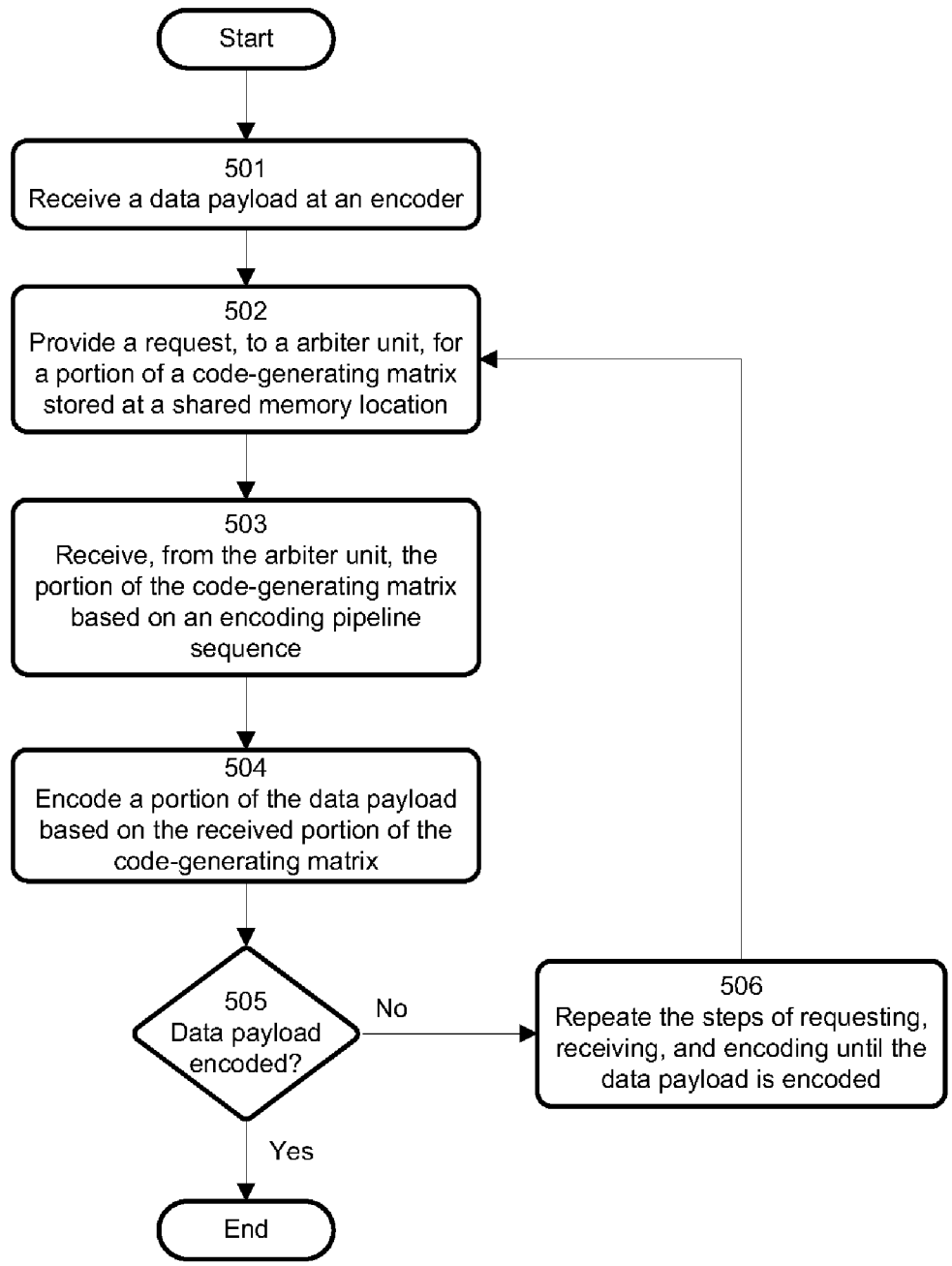
FIG. 5 depicts a flowchart of an example method for encoding data using a plurality of encoders.

FIG. 5 depicts a flowchart of an example method for encoding data using a plurality of encoders according to one aspect of the subject technology. Each of the plurality of encoders may encode a different payload of data. In block 501, a data payload is received at an encoder. In block 502, a request for a portion of a code-generating matrix stored at a shared memory location is provided to an arbiter unit. In block 503, the portion of the code-generating matrix is received (for example, from the arbiter unit) based on an encoding pipeline sequence. For example, the matrix may be received at one of a predetermined number of access times, with each access time corresponding to one of the plurality of encoders.

In block 504, a portion of the data payload is encoded based on the received portion of the code-generating matrix. In this regard the encoding may operate in parallel with an encoding initiated by at least one other encoder. Encoding the portion of the data payload may include, for example, encoding a first subportion of the portion of the data payload based on the received portion of the code-generating matrix, iteratively shifting the received portion of the code-generating matrix, and encoding a different subportion of the portion of the data payload, based on a shifted portion of the code-generating matrix, until the portion of the data payload is encoded. In some aspects, the code-generating matrix may include a plurality of circulants, and wherein the received portion of the code-generating matrix comprises one or more one-dimensional arrays corresponding to one or more respective circulants. In this regard, encoding may include shifting, at the encoder, the one or more one-dimensional arrays over a plurality of clock cycles to encode the portion of the data payload based on the one or more respective circulants. Moreover, each bit of the data payload may be encoded based on a bit value located at a corresponding bit position of the one or more one-dimensional arrays.

In block 505, the process determines whether the data payload has been encoded. If encoding has been completed, the process ends. Otherwise, in block 506, blocks 502, 503, and 504 are repeated until the data payload is encoded.

The subject technology is not limited to any particular size of LDPC code nor any particular circulant size and/or row weight for the code. In addition, the data storage system may be implemented with more than one arbiter unit and generator matrix storage. For example, encoding channels may be grouped into multiple groups of encoders with each group assigned and coupled to a respective arbiter unit and associated generator matrix storage.

Figure 6:
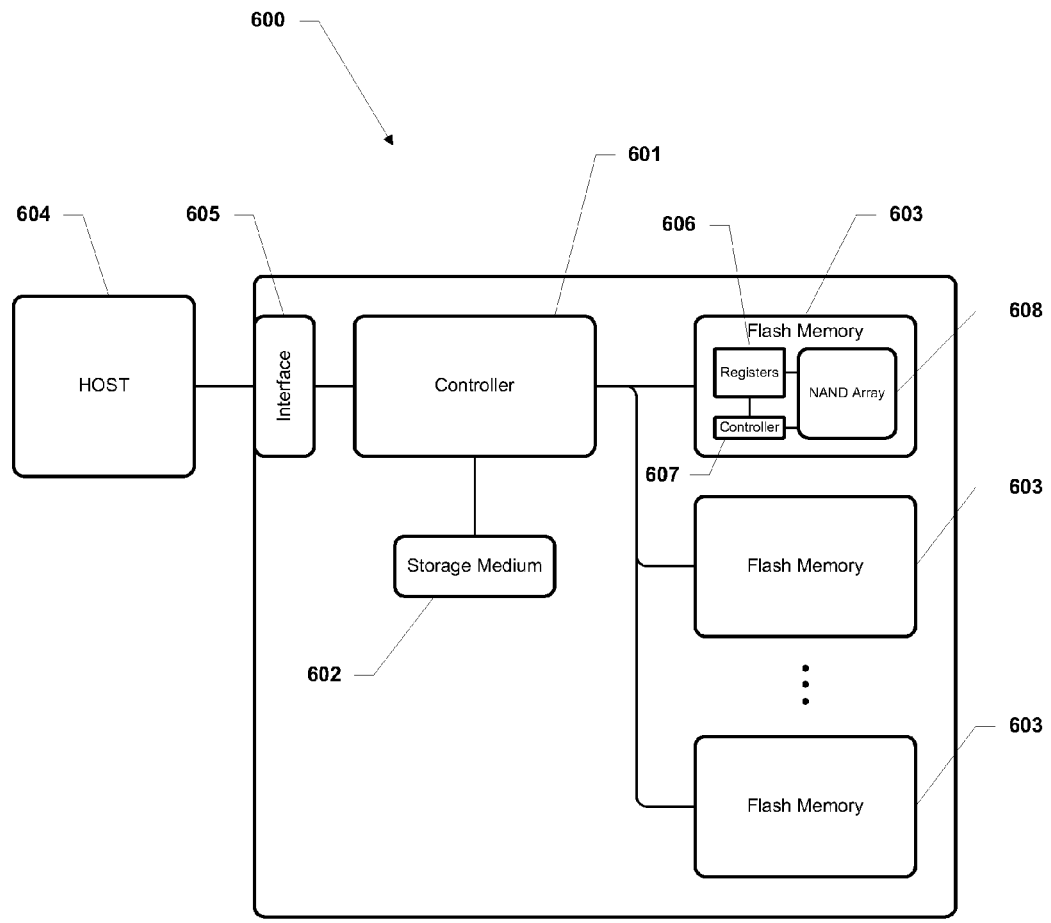
FIG. 6 is a block diagram illustrating example components of a data storage system.

FIG. 6 is a block diagram illustrating example components of a data storage system 600 (for example, a solid state drive) according to one aspect of the subject technology. Data storage system 600 may include a data storage controller 601 (for example, data storage controller 401), storage medium 602, and flash memory 603 (for example, one or more flash arrays 404). Controller 601 may use storage medium 602 for temporary storage of data and information used to manage data storage system 600. Controller 601 may include several internal components (not shown) such as one or more processors (for example, one or more processors 103), a read-only memory, a flash component interface (for example, a multiplexer to manage instruction and data transport along a serial connection to flash memory 603), an I/O interface, error correction circuitry, and the like. In some aspects, all of these elements of controller 601 may be integrated into a single chip. In other aspects, these elements may be separated on their own PC board.

Controller 601 may also include a processor configured to execute code or instructions to perform the operations and functionality described herein, manage request flow and address mappings, and to perform calculations and generate commands. The processor of controller 601 is configured to monitor and control the operation of the components in data storage controller 601. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 601 and/or its processor. One or more sequences of instructions may be software stored and read from storage medium 602, flash memory 603, or received from host device 604 (for example, via host interface 605). ROM, storage medium 602, flash memory 603, represent examples of machine or computer readable media on which instructions/code executable by controller 601 and/or its processor may be stored. Machine or computer readable media may generally refer to any medium or media used to provide instructions to controller 601 and/or its processor, including both volatile media, such as dynamic memory used for storage media 602 or for buffers within controller 601, and non-volatile media, such as electronic media, optical media, and magnetic media.

In some aspects, controller 601 is configured to store data received from a host device 604 in flash memory 603 in response to a write command from host device 604. Controller 601 is further configured to read data stored in flash memory 603 and to transfer the read data to host device 604 in response to a read command from host device 604. As will be described in more detail below, controller 601 is configured to, on determining certain operating conditions are present, suspend an erase operation performed on a block and/or page of memory. By dynamically and selectively suspending erase operations performed on flash memory 603, the subject technology may improve SSD performance and reduce flash memory wear compared to performance of SSD using flash memory cells in the same application environment without the ability to dynamically suspend erase operations.

Host device 604 represents any device configured to be coupled to data storage system 600 and to store data in data storage system 600. Host device 604 may be a computing system such as a personal computer, a server, a workstation, a laptop computer, PDA, smart phone, and the like. Alternatively, host device 604 may be an electronic device such as a digital camera, a digital audio player, a digital video recorder, and the like.

In some aspects, storage medium 602 represents volatile memory used to temporarily store data and information used to manage data storage system 600. According to one aspect of the subject technology, storage medium 602 is random access memory (RAM) such as double data rate (DDR) RAM. Other types of RAM also may be used to implement storage medium 602. Memory 602 may be implemented using a single RAM module or multiple RAM modules. While storage medium 602 is depicted as being distinct from controller 601, those skilled in the art will recognize that storage medium 602 may be incorporated into controller 601 without departing from the scope of the subject technology. Alternatively, storage medium 602 may be a non-volatile memory such as a magnetic disk, flash memory, peripheral SSD, and the like.

As further depicted in FIG. 6, data storage system 600 may also include host interface 605. Host interface 605 is configured to be coupled to host device 604, to receive data from host device 604 and to send data to host device 604. Host interface 605 may include both electrical and physical connections for operably coupling host device 604 to controller 601, for example, via the I/O interface of controller 601. Host interface 605 is configured to communicate data, addresses, and control signals between host device 604 and controller 601. Alternatively, the I/O interface of controller 601 may include and/or be combined with host interface 605. Host interface 605 may be configured to implement a standard interface, such as Serial-Attached SCSI (SAS), Fiber Channel interface, PCI Express (PCIe), SATA, USB, and the like. Host interface 605 may be configured to implement only one interface. Alternatively, host interface 605 (and/or the I/O interface of controller 601) may be configured to implement multiple interfaces, which are individually selectable using a configuration parameter selected by a user or programmed at the time of assembly. Host interface 605 may include one or more buffers for buffering transmissions between host device 604 and controller 601.

Flash memory 603 represents a non-volatile memory device for storing data. According to one aspect of the subject technology, flash memory 603 includes, for example, a NAND flash memory. Flash memory 603 may include a single flash memory device or chip, or, as depicted by FIG. 1, may include multiple flash memory devices or chips arranged in multiple channels. Flash memory 603 is not limited to any particular capacity or configuration. For example, the number of physical blocks, the number of physical pages per physical block, the number of sectors per physical page, and the size of the sectors may vary within the scope of the subject technology.

Flash memory may have a standard interface specification. This standard ensures that chips from multiple manufacturers can be used interchangeably (at least to a large degree). The interface may further hide the inner working of the flash memory and return only internally detected bit values for data. The interface of flash memory 603 may be used to access one or more internal registers 606 and an internal flash controller 607. In some aspects, registers 606 may include address, command, control, and/or data registers, which internally retrieve and output the necessary data to and from a NAND memory cell array 608. For example, a data register may include data to be stored in memory array 608, or data after a fetch from memory array 608, and may also be used for temporary data storage and/or act like a buffer. An address register may store the memory address from which data will be fetched to host 604 or the address to which data will be sent and stored. In some aspects, a command register may be included to control parity, interrupt control, and/or the like. In some aspects, internal flash controller 607 is accessible via a control register to control the general behavior of flash memory 603. Internal flash controller 607 and/or the control register may control the number of stop bits, word length, receiver clock source, and may also control switching the addressing mode, paging control, coprocessor control, and the like.

In some aspects, registers 606 may include a test register. The test register may, for example, be accessed by specific addresses and/or data combinations provided at the interface of flash memory 603 (for example, by specialized software provided by the manufacturer to perform various tests on the internal components of the flash memory). The test register may be used to access and/or modify other internal registers, for example, the command and/or control registers. In some aspects, test modes accessible via the test register may be used to input or modify certain programming conditions of flash memory 603 (for example, erase parameters) to dynamically vary how data is programmed or erased from the memory cells of memory arrays 608.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A system for encoding data in parallel using multiple encoders, comprising:
   a shared memory including code-generating matrix data stored thereon;
   a plurality of encoders operably connected to the shared memory, each encoder configured to encode a data payload to generate a codeword; and
   an arbiter unit operably connected to the plurality of encoders and the shared memory, the arbiter unit configured to:
   receive, from the plurality of encoders, respective requests for a portion of the matrix data; and
   provide the portion of the matrix data to the plurality of encoders at staggered times for use in respective encoding operations.

2. The system of claim 1, wherein each encoder is configured to:
   perform an encoding operation to encode a first payload portion of the data payload based on the provided portion of the matrix; and
   request, on completion of the encoding operation, from the arbiter unit, a subsequent portion of the matrix to encode a subsequent portion of the data payload.

3. The system of claim 2, wherein the encoding operation comprises:
   encoding a first part of the first payload portion based on the provided portion of the matrix;
   shifting the provided portion of the matrix to generate a shifted portion of the matrix;
   encoding a different part of the first payload portion based on the shifted portion of the matrix; and
   repeating the steps of shifting and encoding until the first payload portion is encoded.

4. The system of claim 1, wherein the arbiter unit provides the portion of the matrix data to each of the plurality of encoders by providing each respective encoder access to the shared memory according to a predetermined sequence.

5. The system of claim 1, wherein the matrix comprises a plurality of circulants, and wherein the provided portion of the matrix comprises circulant data for facilitating the generation of at least a portion of the plurality of circulants.

6. The system of claim 5, wherein the arbiter unit is further configured to:
   maintain an index for each of the plurality of circulants;
   maintain a current iteration of the index for each of the plurality of encoders;
   receive an indication that an encoder is initiating an encoding of an un-encoded portion of the data payload; and
   provide, on the indication, the circulant data based on a current iteration of the index for the encoder.

7. The system of claim 5, wherein the circulant data comprises multiple one-dimensional arrays, each array corresponding to a respective circulant, wherein an encoding operation performed by an encoder facilitates an encoding of each bit of the data payload based on a bit value at a corresponding position of each of the multiple one-dimensional arrays.

8. A method for encoding data using a plurality of encoders, the method comprising:
   receiving a data payload at an encoder;
   providing a request, to an arbiter unit, for a portion of a matrix stored at a shared memory location;

receiving the portion of the matrix at one of a predetermined number of access times, each access time corresponding to one of the plurality of encoders;

encoding a portion of the data payload based on the portion of the matrix, the encoding operating in parallel with an encoding initiated by at least one other encoder; and repeating the steps of requesting, receiving, and encoding until the data payload is encoded.

9. The method of claim 8, wherein encoding the portion of the data payload comprises:

encoding a first subportion of the data payload based on the received portion of the matrix; and iteratively shifting the received portion of the matrix to generate a shifted portion of the matrix, and encoding a different subportion of the data payload based on a shifted portion of the matrix, until the portion of the data payload is encoded.

10. The method of claim 8, wherein the matrix comprises a plurality of circulants, and wherein the received portion of the matrix comprises one or more one-dimensional arrays corresponding to one or more respective circulants.

11. The method of claim 10, wherein the step of encoding comprises:

iteratively shifting, at the encoder, the one or more one-dimensional arrays over a plurality of clock cycles to encode the portion of the data payload.

12. The method of claim 11, wherein each bit of the data payload is encoded based on a bit value located at a corresponding bit position of the one or more one-dimensional arrays.

13. The method of claim 8, wherein the at least one other encoder encodes a different payload of data.

14. A system for encoding data using a plurality of encoders, the system comprising:

a shared memory including code-generating matrix data stored thereon;

an arbiter unit configured to provide access to the shared memory according to a predetermined sequence; and a plurality of encoders operably connected to the arbiter unit and the shared memory, each encoder configured to:
  receive a data payload;
  receive a first set of elements based on the matrix data according to a sequence designated by the arbiter unit;
  encode, on receiving the first set of elements, a portion of the data payload based on the first set of elements, the portion of the data payload being encoded in parallel with an encoding initiated by at least one other encoder; and
  receive a second set of elements after the encoding of the portion of the data payload is completed, according to the sequence designated by the arbiter unit.

15. The system of claim 14, wherein the first set of elements comprises a one-dimensional array of elements spanning the one or more of the plurality of submatrices.

16. The system of claim 14, wherein the encoding initiated by the at least one other encoder is based on the first set of elements.

17. The system of claim 16, wherein the data payload is a different payload than a payload encoded by the at least one other encoder.

18. The system of claim 14, wherein the first set of elements comprises multiple one-dimensional arrays, each corresponding to respective submatrices at identical respective positions within the respective submatrices.

19. The system of claim 18, wherein the portion of the data payload includes a plurality of bits, a bit encoded based on bit values located at corresponding positions within the multiple one-dimensional arrays.

20. The system of claim 18, wherein the second set of elements is based on a different set of submatrices.

* * * * *